(12) United States Patent
Chiou et al.

(10) Patent No.: US 6,933,209 B2
(45) Date of Patent: Aug. 23, 2005

(54) STACKING MEMORY CHIPS USING FLAT LEAD-FRAME WITH BREAKAWAY INSERTION PINS AND PIN-TO-PIN BRIDGES

(75) Inventors: Ren-Kang Chiou, Fremont, CA (US); Tzu-Yih Chu, San Jose, CA (US)

(73) Assignee: Super Talent Electronics Inc., San Jose, CA (US)

( * ) Notice: Subject to any disclaimer, the term of this patent is extended or adjusted under 35 U.S.C. 154(b) by 35 days.

(21) Appl. No.: 10/707,624

(22) Filed: Dec. 24, 2003

(65) Prior Publication Data

US 2005/0142694 A1  Jun. 30, 2005

(51) Int. Cl.[7] .................. H01L 21/46; H01L 21/76; H01L 21/78; H01L 21/301
(52) U.S. Cl. ............... 438/455; 438/458; 438/462; 438/464
(58) Field of Search ............... 438/455, 458, 438/462, 464

(56) References Cited

U.S. PATENT DOCUMENTS

| | | | |
|---|---|---|---|
| 4,743,956 A | 5/1988 | Olla et al. ............... 257/674 |
| 4,884,237 A | 11/1989 | Mueller et al. ............ 365/63 |
| 5,138,438 A | 8/1992 | Masayuki et al. ......... 257/686 |
| 5,434,745 A | 7/1995 | Shokrgozar et al. ....... 361/735 |
| 5,490,041 A | 2/1996 | Furukawa et al. ........ 361/777 |
| 5,587,341 A | 12/1996 | Masayuki et al. ......... 438/109 |
| 5,677,569 A | 10/1997 | Choi et al. ............... 257/686 |
| 5,780,925 A | 7/1998 | Cipolla et al. ............ 257/676 |
| 6,028,352 A | 2/2000 | Eide ....................... 257/686 |
| 6,081,798 A * | 6/2000 | Johnson et al. ............. 706/54 |
| 6,307,256 B1 | 10/2001 | Chiang et al. ............ 257/668 |
| 6,388,336 B1 | 5/2002 | Venkateshwaran et al. . 257/779 |
| 6,461,938 B2 * | 10/2002 | Nakabayashi ............ 438/458 |
| 6,521,993 B2 | 2/2003 | Masayuki et al. ......... 257/723 |
| 6,542,393 B1 | 4/2003 | Chu et al. ................ 365/51 |
| 6,566,760 B1 | 5/2003 | Kawamura et al. ........ 257/777 |
| 6,603,196 B2 | 8/2003 | Lee et al. ................ 257/676 |
| 6,617,673 B2 | 9/2003 | Lee et al. ................ 257/676 |

* cited by examiner

*Primary Examiner*—W. David Coleman
*Assistant Examiner*—William M. Brewster
(74) *Attorney, Agent, or Firm*—Stuart T. Auvinen

(57) ABSTRACT

Memory chips are assembled into a stack with an insertion-pin frame between pins of two stacked memory chips. The insertion-pin frame is not bent or formed into 3-dimensional shapes but is flat, improving use in standard surface-mount processes such as solder printing onto the insertion-pin frame. Flat insertion pins held to the flat insertion-pin frame by necks are soldered to top shoulders of pins on a lower chip. Then bottom feet of pins of an upper chip are soldered to the insertion pins. The necks are punched away or broken to release the insertion-pin frame from the insertion pins that are soldered to the assembled stacked chips. An insulated wire jumper can be placed under the pins to jumper chip-select connections, or a bridge between insertion pins can be formed from the insertion-pin frame. Holding tabs to the bridge are removed with the insertion pins or by punching.

18 Claims, 13 Drawing Sheets

US 6,933,209 B2

STACKING MEMORY CHIPS USING FLAT LEAD-FRAME WITH BREAKAWAY INSERTION PINS AND PIN-TO-PIN BRIDGES

BACKGROUND OF INVENTION

This invention relates to manufacturing of memory modules, and more particularly for processes for stacking memory chips.

The popularity of memory modules today is quite high. Many devices besides personal computers (PC's) use memory modules. Most PC's are shipped with sockets for memory modules so that the owners can later add additional modules, increasing the memory capacity of their PC's. High-volume production and competition have driven module costs down dramatically, benefiting the buyer.

Memory modules are made in many different sizes and capacities, with the old 30-pin modules replaced by 72-pin, 168-pin, and larger modules. The "pins" were originally pins or leads extending from the module's edge, but now most modules are leadless, having metal contact pads or fingers. The modules are small in size, some being about 5.25 inches long and 1.2 or 1.7-inches high.

The modules contain a small printed-circuit board (PCB) substrate, typically a multi-layer board with alternating laminated layers of fiberglass insulation and foil or metal interconnection layers. Surface mounted components are soldered onto one or both surfaces of the substrate. Dynamic-random-access memory (DRAM) integrated circuits (IC's) or chips are commonly packaged in inexpensive surface-mount packages such as small-outline J-leaded (SOJ) packages, plastic leaded chip carriers (PLCC), small-out-line packages (SOP) or thin small-outline packages (TSOP).

The number of DRAM chips used in a module depends on the capacity and data-width of the DRAM chips and the size of the memory module. For example, a memory module constructed from 64 Mega-bit×4-bit-output DRAM chips requires 16 of these 4-bit-wide DRAM chips to fill a 64-bit data bus. The module then has a capacity of 512 Megabytes (MB).

FIG. 1 is a schematic of a memory module with two banks of DRAM chips. DRAM chips 12–16 form a first bank, while DRAM chips 22–26 form a second bank. A total of 16 DRAM chips 12–16 are in the first bank, while another 16 DRAM chips 22–26 are in the second bank. When 64 Mega-bit×4 DRAM chips are used, each bank contains 512 MB.

Most signals are shared by all DRAM chips in both banks. For example, control signals such as RAS (row address strobe), CAS (column address strobe), WE (write-enable), clock, etc. and address lines are connected to all DRAM chips in both banks on the memory module. Data lines are each shared by one chip in each of the banks. Data lines D0–D3 are shared by DRAM chip 12 in the first bank and DRAM chip 22 in the second bank. Likewise, data lines D4–D7 are shared by DRAM chips 13, 23.

The banks are selected by chip-select signals. Only one chip select is activated at a time for the memory module. Chip select CS1 activates DRAM chips 12–16 in the first bank, while chip select CS0 selects DRAM chips 22–26 in the second bank. When the bank's chip select is not activated, the control signals are ignored by DRAM chips in the bank. The data lines are not driven by the non-selected bank of DRAM chips to prevent data conflicts.

FIG. 2 shows a prior-art double-bank memory module with stacked DRAM chips. While a 2-bank memory module can be constructed from non-stacked chips, twice as much surface area on the substrate would be needed. The memory module contains a substrate 10, with surface-mounted DRAM chips 22–26 mounted directly to the front surface or side of substrate 10, while more DRAM chips (not visible) are mounted to the back surface or side of substrate 10. Eight stacks of DRAM chips can be mounted on the front surface of substrate 10 for bits D0–31, while another eight stacks of chips can be mounted on the back surface for bits D32–63. Metal contact pads 20 are positioned along the connector edge of the module on both front and back surfaces. Metal contact pads 20 mate with pads on a module socket to electrically connect the module to a PC's motherboard. Holes and/or notches are usually used to ensure that the module is correctly positioned and securely seated in the socket.

Often the number of DRAM chips desired on a memory module is larger than the available substrate surface area. One method to mount more DRAM chips to a module is to stack DRAM chips on top of one another. For example, DRAM chip 12 can be mounted directly on top of DRAM chip 22. The leads or pins of upper DRAM chip 12 can be soldered to the leads or pins of lower DRAM chip 22.

Usually DRAM chips from separate banks are stacked together. The DRAM chips stacked together share the same data lines as well as control signals. DRAM chips 12–16 of the first bank are stacked on top of DRAM chips 22–26 of the second bank. When chips are mounted on both sides of substrate 10, two chips can be stacked together on the front surface and two chips can be stacked together on the back surface at each mounting location of the substrate. Each surface can have 8 mounting locations for DRAM chips, for a total of 16 mounting locations (only 5 locations are shown in the Fig.). With stacking, a total of 32 DRAM chips can be mounted to substrate 10.

FIG. 3 is an exploded view showing stacking of a pair of DRAM chips. Upper DRAM chip 12 of the first bank is mounted on the top of the stack, with lower DRAM chip 22 mounted below onto the module substrate. One side of pins is shown, but pins are usually on two or even on all four sides or edges of a DRAM IC package.

Between upper DRAM chip 12 and lower DRAM chip 22 is thin PCB 30. Thin PCB 30 is a thin circuit board that can be made from fiberglass with printed metal layers on its two major surfaces. Thin PCB 30 has bonding pads 40 on its upper surface that are arranged for making contact with the pins S1–S7 from upper DRAM chip 12. The pins from upper DRAM chip 12 are soldered to these bonding pads 40 on the upper surface of thin PCB 30 during manufacturing.

The bottom surface of thin PCB 30 also has leads C1–C7 that are aligned to make contact with the tops of the pins S1–S7 of lower DRAM chip 22. These leads C1–C7 of thin PCB 30 are soldered to the pins S1–S7 of lower DRAM chip 22. Thus thin PCB 30 has bonding pads on the top surface that are soldered to pins of upper DRAM chip 12, and has leads that are soldered to pins of lower DRAM chip 22.

Each of the leads is connected to an upper bonding pad either directly above or through a drilled via or a metalized connection through the substrate of thin PCB 30. Thus thin PCB 30 electrically connects pins from lower DRAM chip 22 to the pins of upper DRAM chip 12 that are directly above.

All of the address, data, RAS, CAS, clock, power, ground, and most other signals are shared among the two stacked DRAM chips 12, 22 in this way by directly connecting corresponding pins S1–S7 in upper and lower DRAM chips 12, 22. For example, pin 1 (signal S1) of upper DRAM chip 12 caries signal S1 and connects through the first of bonding pads 40 on the top surface of thin PCB 30 to lead C1 which is soldered to pin 1 (also signal S1) of lower DRAM chip 22.

While most pins of lower DRAM chip 22 are connected with the pins directly above of upper DRAM chip 12, there are some exceptions. The chip-select pins are disconnected and re-routed by thin PCB 30 so that the stacked DRAM chips receive different chip-select signals. This allows one of the DRAM chips 12, 22 to be selected and the other de-selected.

For example, chip select CS0 connects to lower DRAM chip 22 through pin 3. Chip select CS0 controls the second DRAM bank that includes lower DRAM chip 22. The connection from CS0 to thin PCB 30 is broken by the removal or lack of lead C3 of thin PCB 30. Without the C3 lead, no connection is made between pin 3 of lower DRAM chip 22 and thin PCB 30.

DRAM chips often include unused pins known as no-connect (NC) pins. These pins do not connect to circuitry inside the DRAM chip, but are still present as physical pins or leads on the chip package. In this example, DRAM chips 12, 22 have pin 5 as a NC pin.

Another chip-select CS1 signal from the memory module substrate is connected to pin 5 of lower DRAM chip 22. Rather than leave an isolated bonding pad on the substrate of the memory module under pin 5, this bonding pad is connected by metal traces on the memory module substrate to the CS1 signal line. Since pin 5 is a NC pin, lower DRAM chip 22 ignores this CS1 signal.

However, pin 5 of lower DRAM chip 22 is soldered to lead C5 of thin PCB 30. Wiring trace 32 on thin PCB 30 electrically connects lead C5 to another one of bonding pads 40, the bonding pad with the missing C3 lead. This bonding pad is soldered to pin 3 of upper DRAM chip 12. Thus the CS1 signal from the memory-module substrate is routed up through the no-connect (NC) pin 5 of lower DRAM chip 22 to lead C5 of thin PCB 30. Then wiring trace 32 moves this CS1 signal from C5 to the bonding pad for the missing C3 lead. From this bonding pad for C3, the CS1 signal is carried to pin 3 of upper DRAM chip 12. Pin 3 of DRAM chips 12, 22 is the chip-select input.

Thin PCB 30 allows lower DRAM chip 22 to receive CS0 at its pin-3 chip-select input, while routing CS1 from an unused (NC) pin 5 of lower DRAM chip 22 to the pin-3 chip-select input of upper DRAM chip 12. Other pins may be the NC pin although pin 5 is chosen in the above illustration, for example, the adjacent pin-4 could have been the NC pin.

FIG. 4 shows prior-art DRAM stacked chips using a bent lead-frame. Rather than use thin PCB 30 of FIG. 3, a lead-frame may be used to connect the stacked chips. A bend-ing machine may bend downward the ends of each of the leads on lead-frame 38. Bending the leads downward produces a 90-degree bend as shown. The bent downward portion of each lead is soldered to the tops of lower-chip pins 36, while upper-chip pins 34 from upper DRAM chip 12 are soldered to the non-bent portions of each lead of lead-frame 38. Thus pins (leads) of upper DRAM chip 12 are connected to pins (leads) of lower DRAM chip 22 by bent leads of lead-frame 38.

Leads for chip-select (CS) and no-connect (NC) pins of the DRAM chip can be specially designed for jumper use. A lead for a no-connect pin can be cut off and can be indirectly connected to the lead-frame by the lead for the chip-select pin through a jumper bridge inside of the frame opening. The lead for the no-connect pin is bent downward but from an opposite direction of leads for standard pins, whereas the lead for the chip-select pin stays non-bent. Thus, another chip-select signal CS1 (as in FIG. 3) from the memory-module substrate is routed through the no-connect pin of lower chip 22 to the chip-select pin of upper chip 12.

While useful, such bent-leads of lead-frame 38 are difficult to work with for manufacturer. Bending of the tiny leads on lead-frame 38 is difficult. Lead ends can break off during the bending process, or the angle of bending might not be consistently 90 degrees, causing registration or alignment problems with the tops of lower-chip pins 36 of lower DRAM chip 22. Maintaining co-planarity of all the many bent leads is very difficult, and standard solder printing (especially controlling solder volume) is difficult when leads are not co-planar. Bent leads thus might not be properly soldered to lower-chip pins 36 as a result. Bending some leads but not others on lead-frame 38 makes the process challenging. Bending leads for no-connect pins in an opposite direction produces additional process complexity.

What is desired is an improved process for making stacked memory chips that does not require bending of the leads of a lead-frame. A stacking process using unbent leads in a flat lead-frame is desired.

DETAILED DESCRIPTION

The present invention relates to an improvement in memory-chip stacking. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 5A:
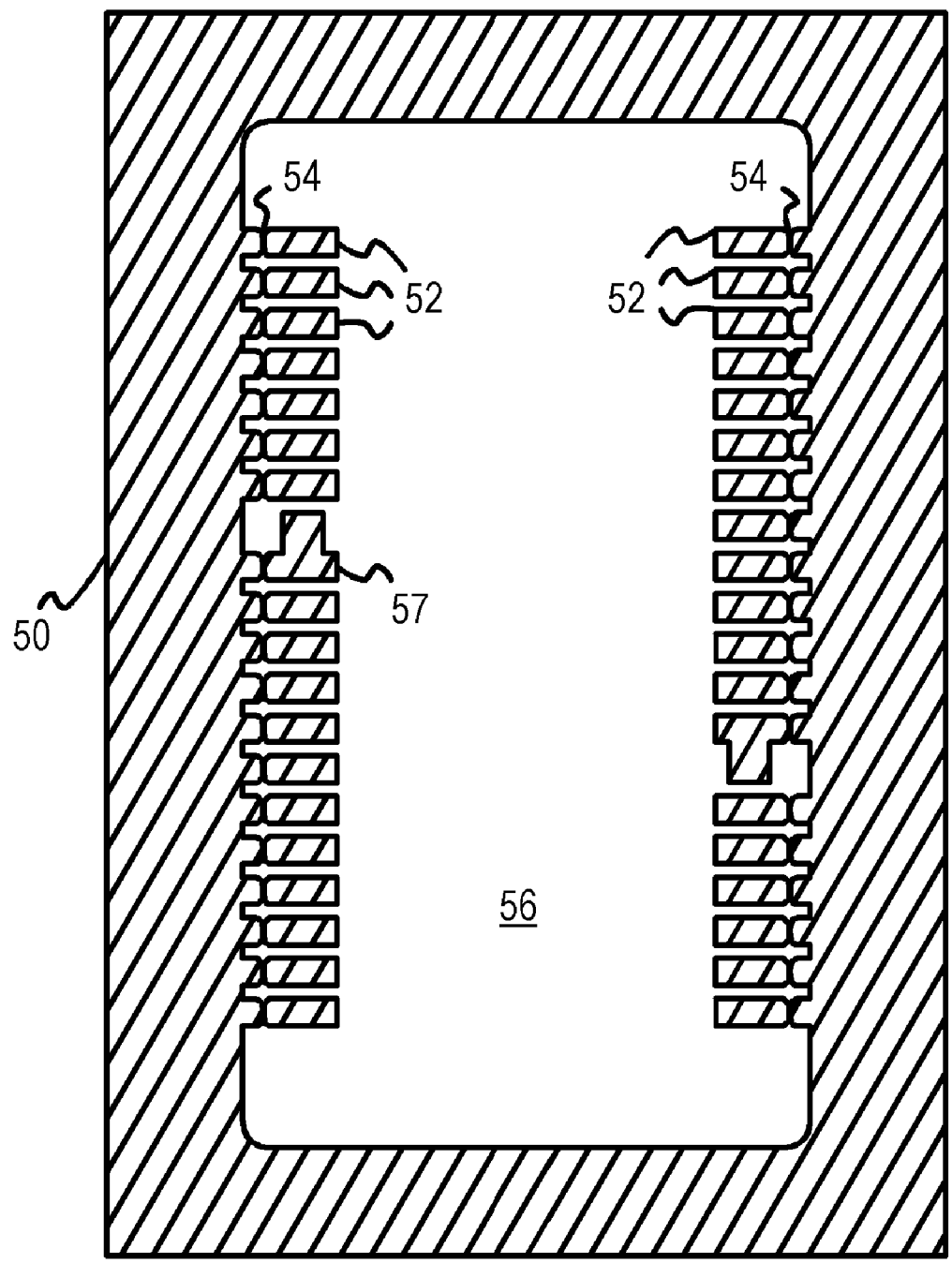
FIG. 5A shows an insertion-pin lead-frame with detachable leads that are flat.

FIG. 5A shows a flat insertion-pin lead-frame with detachable leads or pins. Insertion-pin frame 50 with insertion pins 52 is made of a thin conductive metal sheet of, for example, copper alloy and is typically made by a stamping or etching process. Insertion-pin frame 50 includes a frame that encircles frame opening 56. Many of such insertion-pin frames 50 and frame openings 56 may be formed together on a strip or panel for automated high-volume manufacturing. A memory chip is placed inside each frame opening 56 during the chip-stacking process. The leads or pins of the memory chip are soldered to insertion leads or pins 52 on insertion-pin frame 50.

Breakaway insertion pins 52 are connected to insertion-pin frame 50 by necks 54. Necks 54 allow for separation of insertion pins 52 from insertion-pin frame 50 once pins of a memory chip are soldered to insertion pins 52. Necks 54 can be a half-etched line, a scribed line, or simply a narrowing of insertion pins 52 such as a V-cut neck, or some combination that facilitates detachment.

Figure 1:
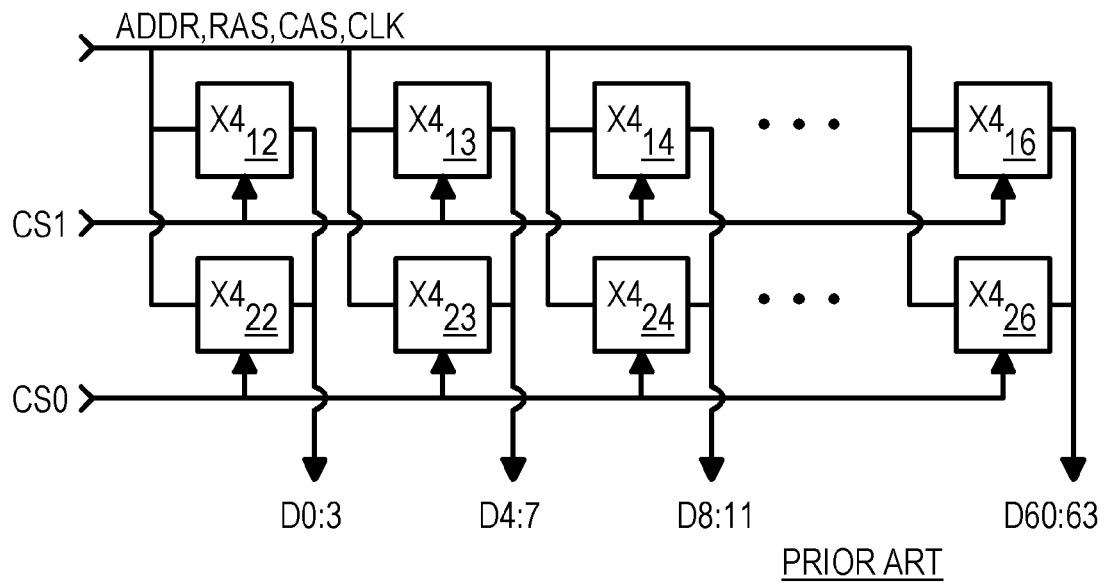
FIG. 1 is a schematic of a memory module with two banks of DRAM chips.
Figure 2:
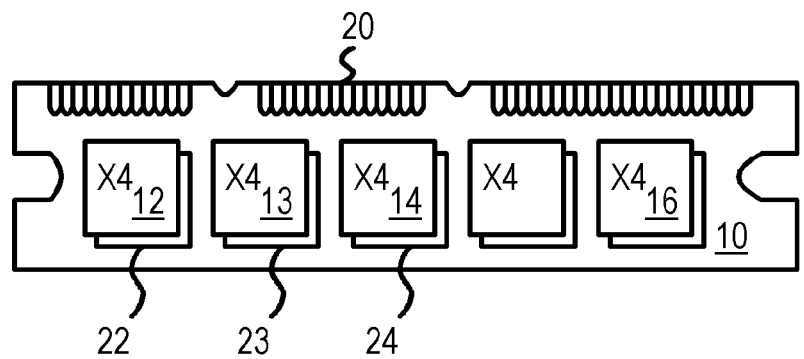
FIG. 2 shows a prior-art double-bank memory module with stacked DRAM chips.
Figure 3:
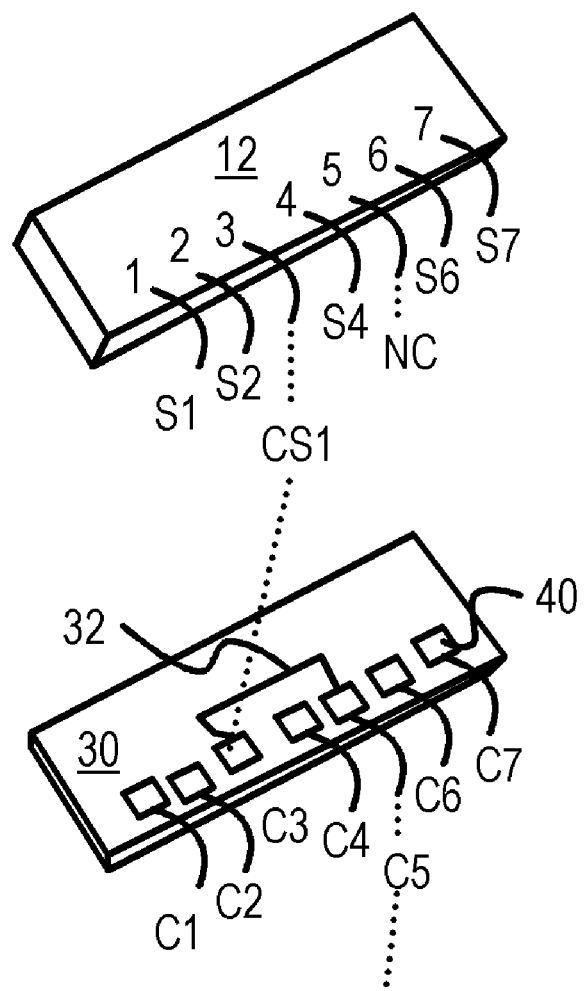
FIG. 3 is an exploded view showing stacking of a pair of DRAM chips.
Figure 4:
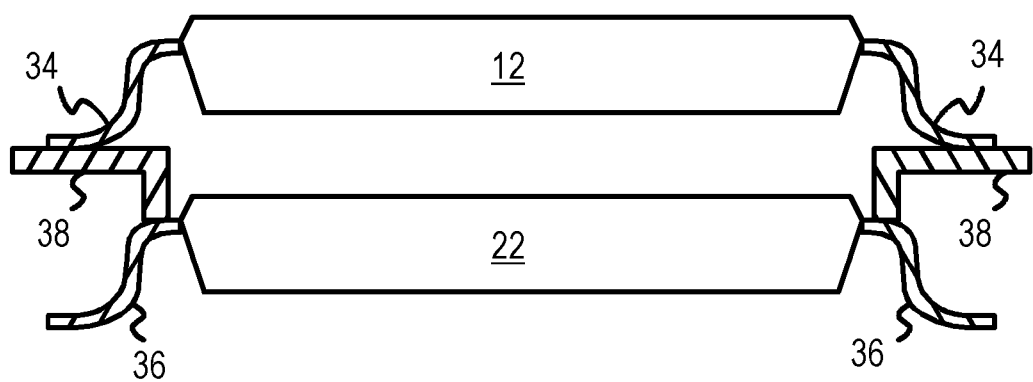
FIG. 4 shows prior-art DRAM stacked chips using a bent lead-frame.

Bridge pin 57 is wider than normal insertion pins 52 and serves as a jumper bridge between two adjacent pins, such as a no-connect pin and a chip-select pin as shown in FIG. 3. The feet of upper-chip pins of upper chip 80 are both soldered to bridge pin 57. However, only one of the shoulders of lower-chip pins of lower chip 60 is soldered to bridge pin 57. The shape of bridge pin 57 has a cutout where the top shoulder of the chip-select pin of lower chip 60 would normally solder to the insertion pin. This cutout of bridge pin 57 thus prevents connection to the chip-select pin of lower chip 60. Bridge pin 57 does solder to the top shoulder of the other (no-connect) pin of lower chip 60 and to the feet of both pins (no-connect and chip-select) of upper chip 80. Thus an electrical path is made from the no-connect pin to the chip-select pin of upper chip 80 while isolating the chip-select pin of lower chip 60.

Figure 5B:
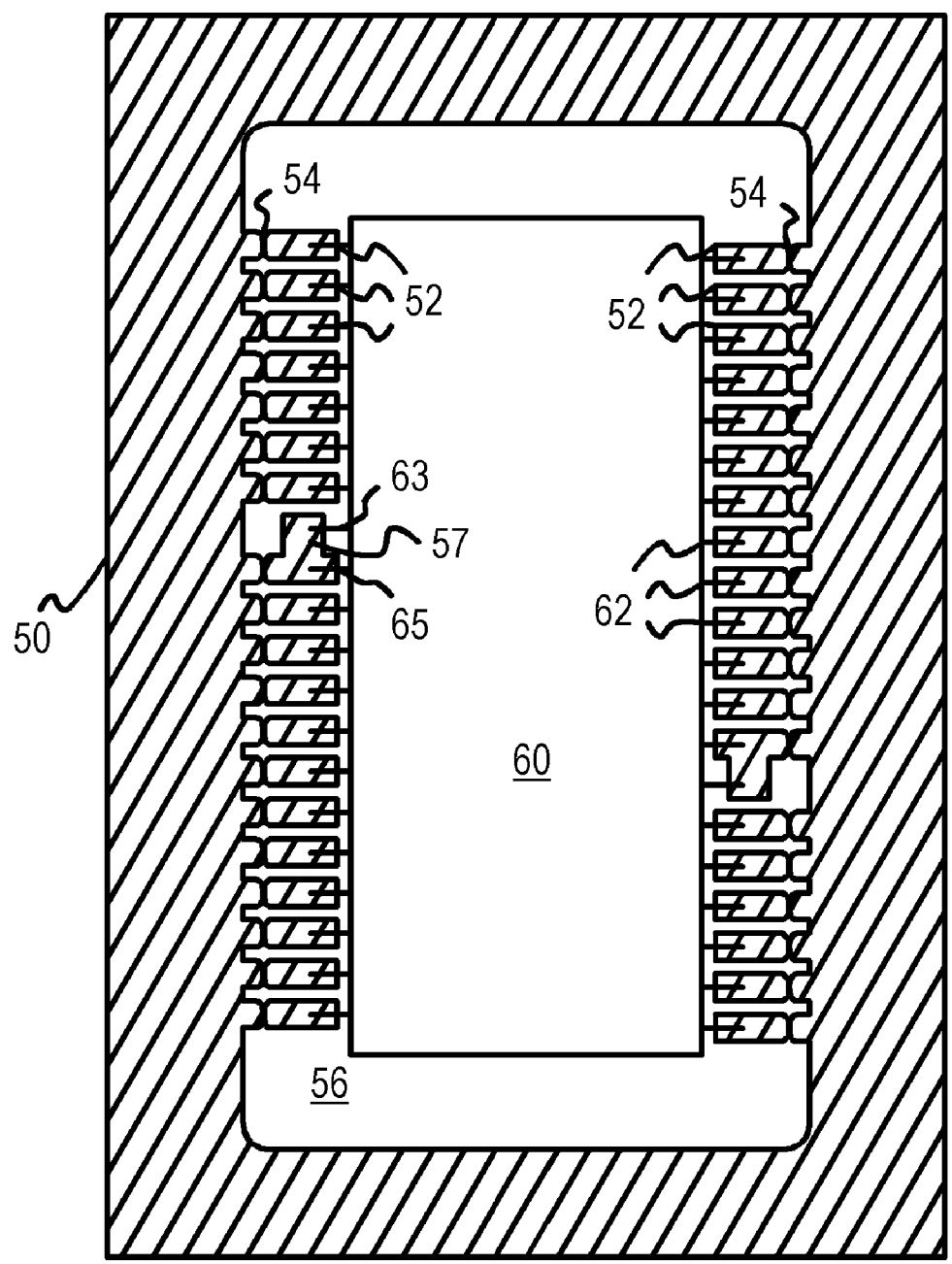
FIG. 5B shows a memory chip soldered to the insertion-pin frame.

FIG. 5B shows a memory chip soldered to the insertion-pin frame. This is a bottom view. Chip 60 contains leads or pins 62 that protrude out from the chip casing on two sides. Chip 60 is flipped and placed in frame opening 56 and pins 62 are aligned over insertion pins 52 and soldered together while insertion pins 52 are still attached to insertion-pin frame 50. The top shoulders of pins 62 are soldered to insertion pins 52. However, chip-select pin 63 of lower chip 60 is not soldered to bridge pin 57 since the cutout of bridge pin 57 removes the insertion-pin metal that normally would contact the top shoulder of pin 63. The adjacent no-connect pin 65 does have its top shoulder soldered to bridge pin 57. Necks 54 can then be broken to detach insertion pins 52 from insertion-pin frame 50.

Figure 5C:
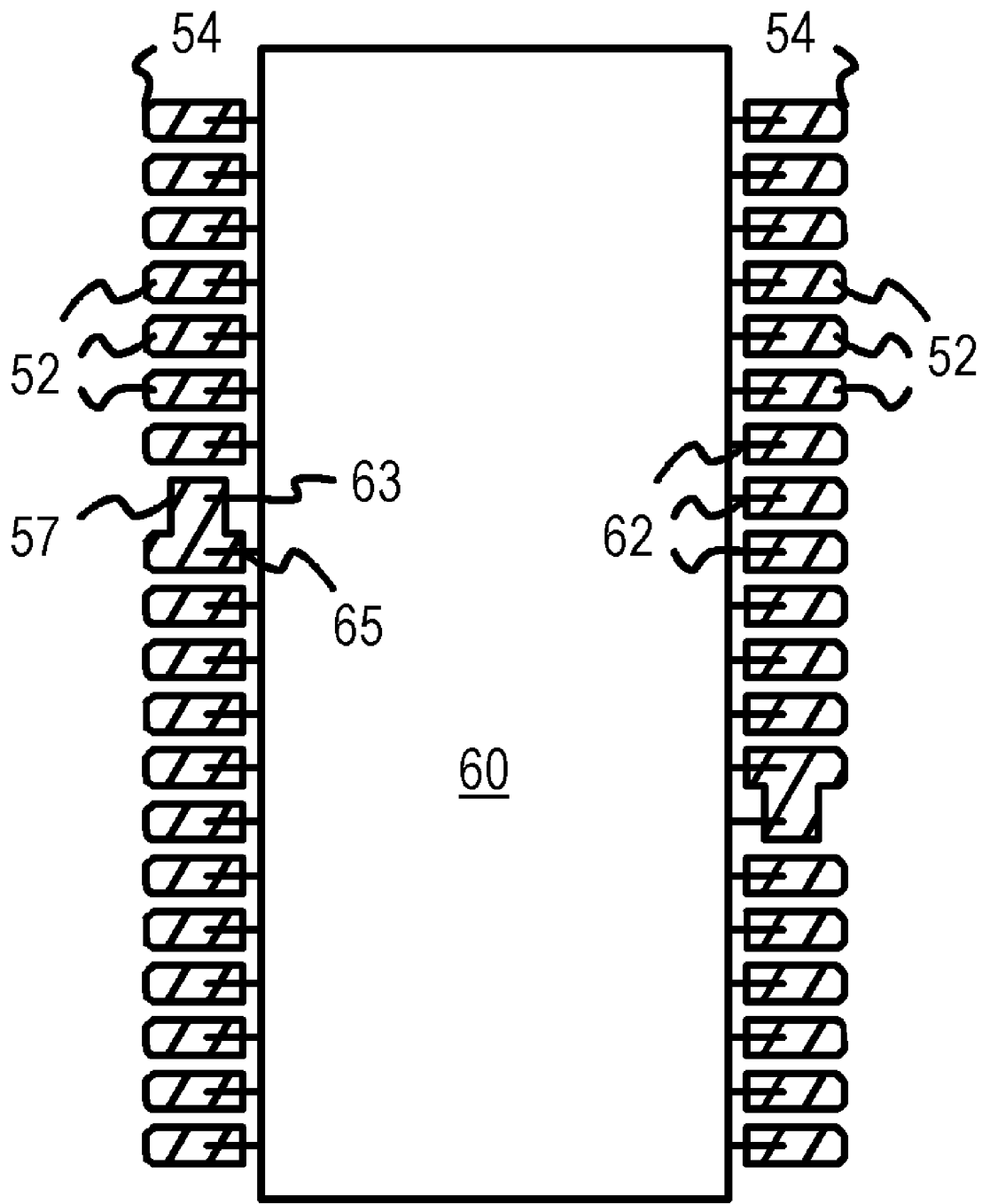
FIG. 5C shows a chip soldered to insertion pins after detachment from the frame.

FIG. 5C shows a chip soldered to insertion pins after detachment from the insertion-pin frame. Once necks 54 are broken, insertion-pin frame 50 can be removed. The top shoulders of pins 62 of chip 60 are soldered to insertion pins 52. However, chip-select pin 63 is not soldered to bridge pin 57, although the adjacent no-connect pin 65 does have its top shoulder soldered to bridge pin 57.

Figures 6A, 6B:
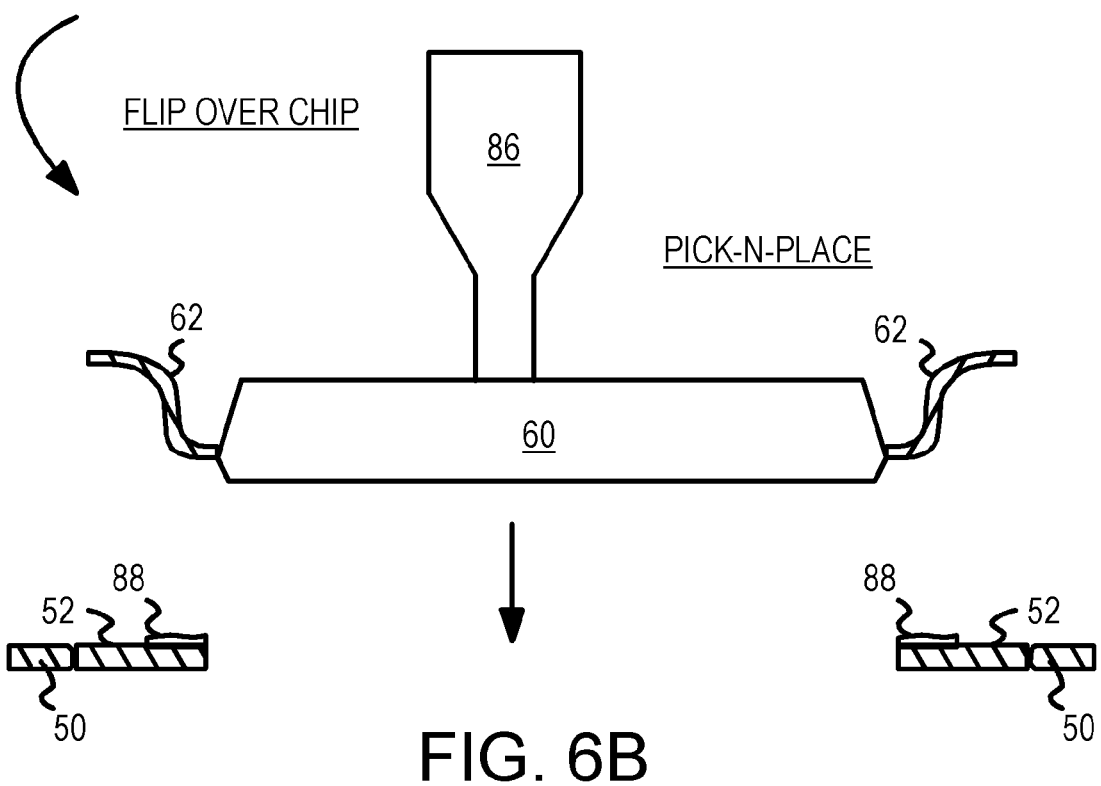
FIGS. 6A–G show a process for stacking chips using a flat insertion-pin frame.

FIGS. 6A–G show a process for stacking chips using a flat insertion-pin frame. A modified surface-mount technology (SMT) process may be used. In FIG. 6A, solder paste 88 is printed onto a surface of insertion pins 52. Insertion pins 52 are held in place and flat by insertion-pin frame 50. Insertion-pin frame 50 provides a flat surface for printing of solder paste 88.

Figure 6C:
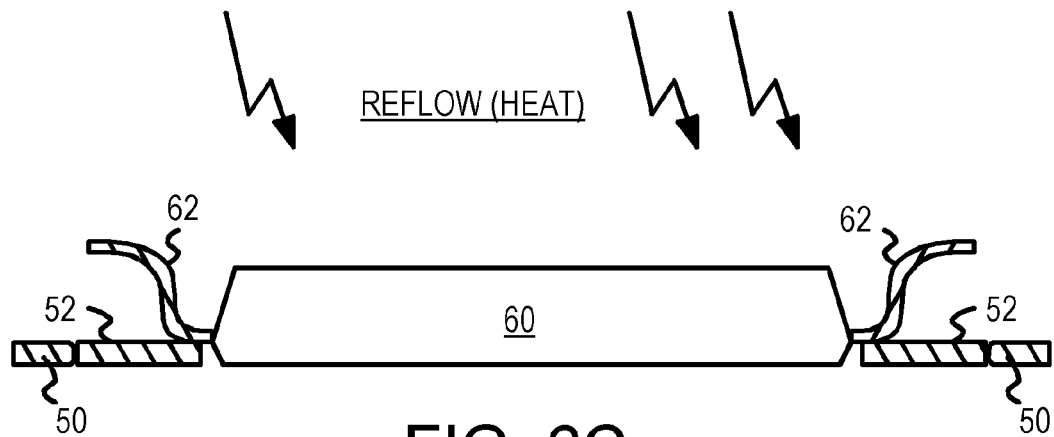

In FIG. 6B, lower chip 60 is inverted and held by a pick-and-place arm or other chip holder 86. Lower chip 60 is aligned to frame opening 56 of insertion-pin frame 50, and pins 62 are aligned to insertion pins 52. The top shoulders of pins 62 are pushed into solder paste 88. In FIG. 6C, heat is applied to re-flow solder paste 88, soldering the top shoulders of pins 62 to insertion pins 52. A cleaning step may be performed to clean off excess solder paste.

Figure 6D:
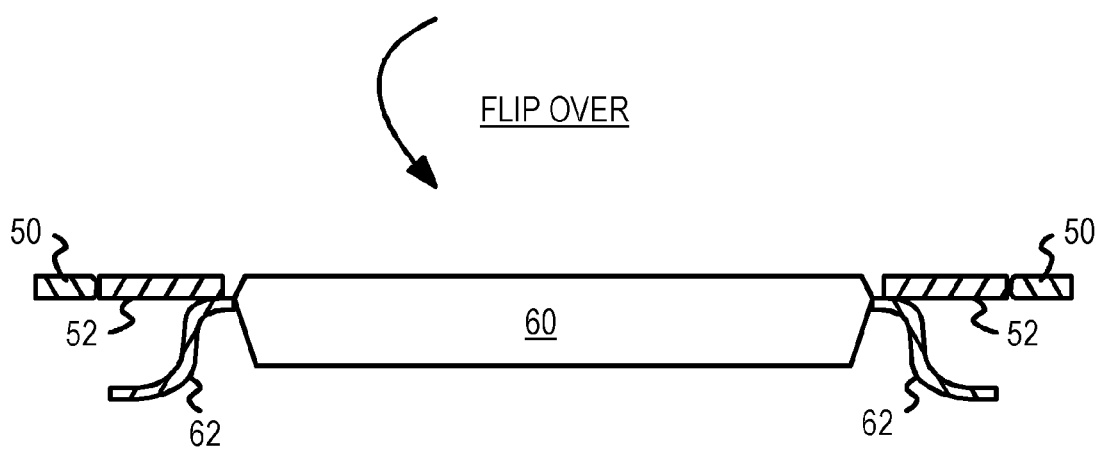

The soldered assembly of lower chip 60 and insertion pins 52 of insertion-pin frame 50 is flipped over as shown in FIG. 6D. The bottom surface of insertion pins 52 have been soldered to the top shoulders of pins 62 of lower chip 60.

Figure 6E:
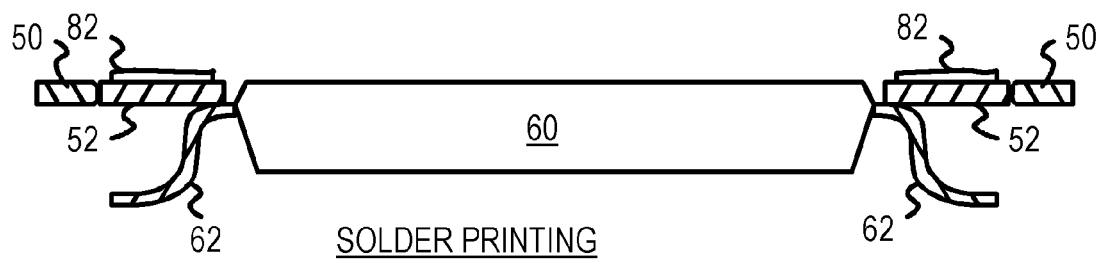

In FIG. 6E, solder paste 82 is printed onto the top surface of insertion pins 52. Solder paste 82 may contain a mix that has a lower melting point than the solder mix of solder paste 88, allowing solder joints produced by solder paste 88 (FIG. 6B) to not melt when solder paste 82 is re-flowed at the lower temperature. Thus pins 62 of lower chip 60 do not become de-tacked when solder paste 82 is heated and re-flowed.

Figure 6F:
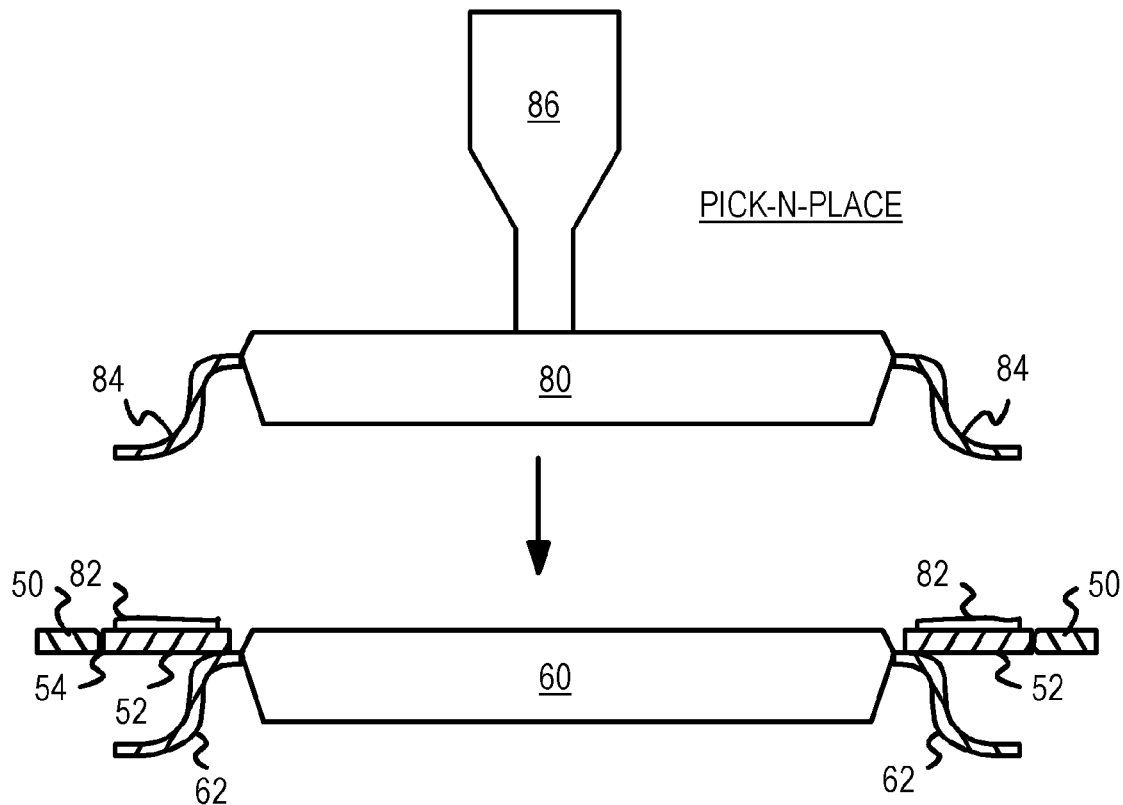

In FIG. 6F, upper chip 80 is picked up and placed over the assembly of lower chip 60 and insertion-pin frame 50. Upper pins 84 are aligned to insertion pins 52. Upper pins 84 are pushed into solder paste 82 on the top surface of insertion pins 52. A solder re-flow step is then performed. Solder paste 82 melts, bonding upper pins 84 to insertion pins 52. Surface tension of the solder may provide a force that tends to self-align upper pins 84 to insertion pins 52.

Figure 6G:
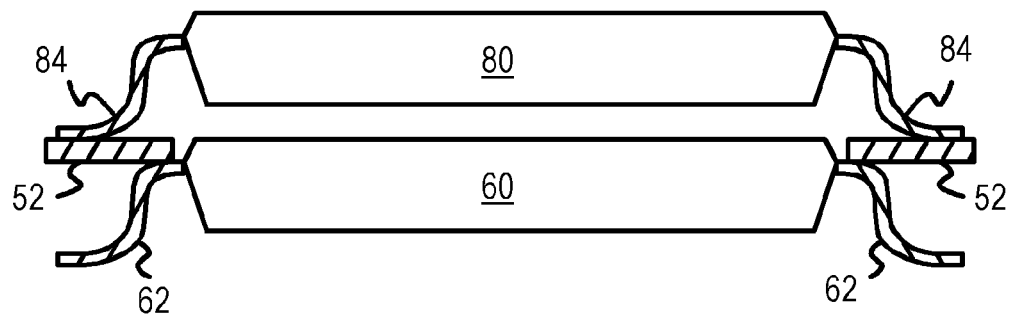

After cooling, insertion-pin frame 50 is detached from insertion pins 52 that are soldered to pins 62 of chip 60 and to upper pins 84 of upper chip 80. Necks 54 are broken to detach insertion pins 52 from insertion-pin frame 50. The final stacked-chip assembly of lower chip 60 and upper chip 80 held together by insertion pins 52 is shown in FIG. 6G. Since insertion pins 52 of insertion-pin frame 50 are not bent, insertion pins 52 provide a flat, co-planar surface for printing solder pastes 82, 88 during two processing steps.

Figure 7A:
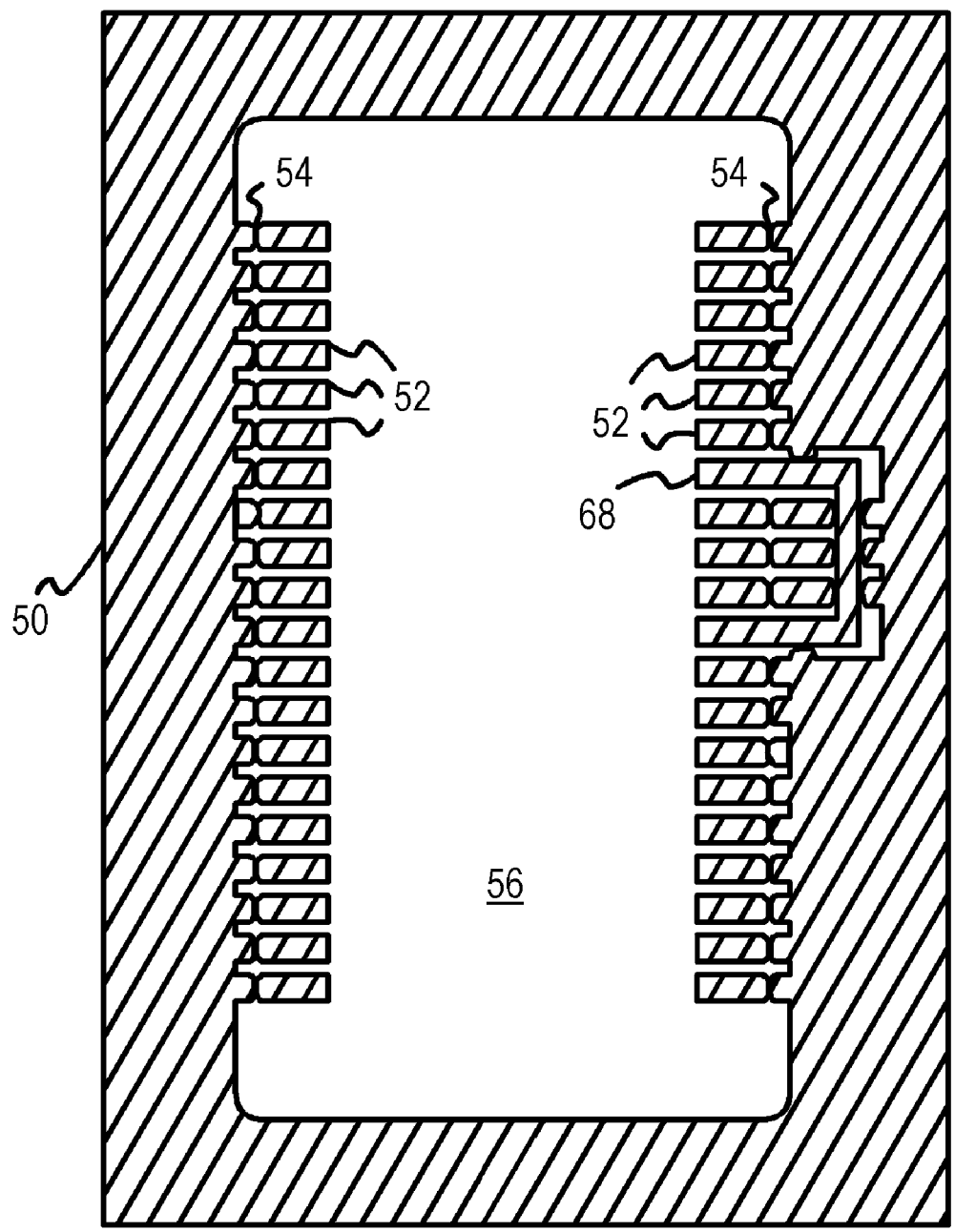
FIGS. 7A–C show jumper bridges outside of the frame opening.
Figure 7B:
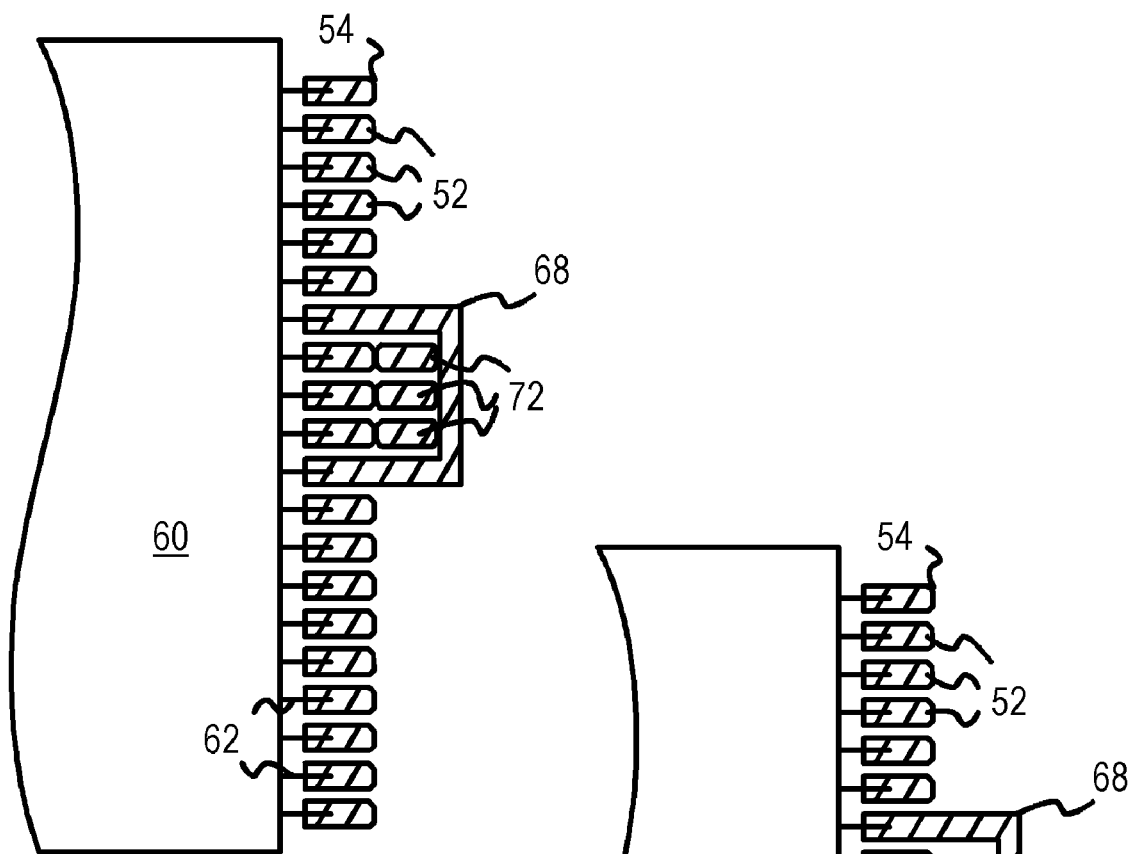
Figure 7C:
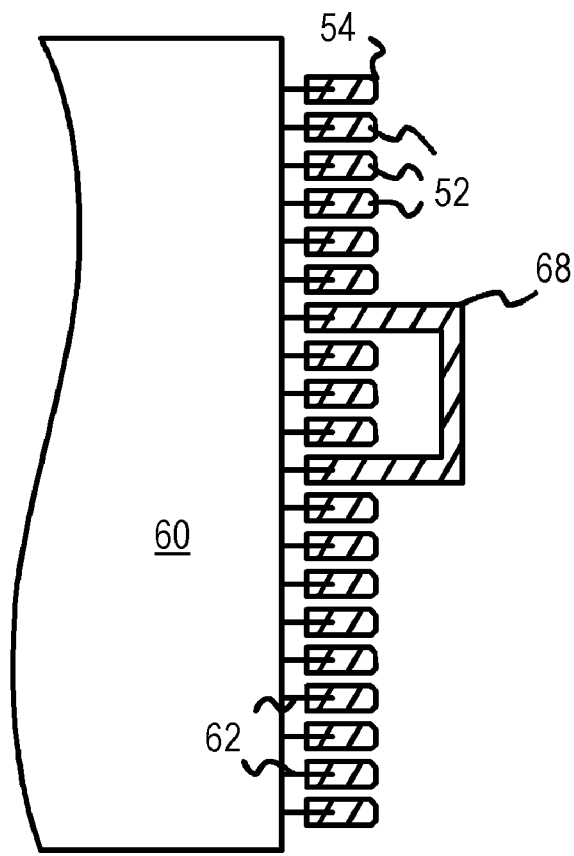

FIGS. 7A–C show jumper bridges placed outside of the frame opening. In FIG. 7A, bridge 68 is formed from insertion-pin frame 50 using additional necks similar to necks 54 that temporarily connect insertion pins 52 to insertion-pin frame 50.

In FIG. 7B, insertion-pin frame 50 has been removed from insertion pins 52 after bonding to pins 62 of chip 60. Upper pins 84 from upper chip 80 have also been bonded to insertion pins 52 but are not shown. Necks 54 and necks connecting bridge 68 to insertion-pin frame 50 have been broken by a punching step so that insertion-pin frame 50 can be removed.

However, holding tabs 72 inside bridge 68 have not yet been removed. Holding tabs 72 are between bridge 68 and the few insertion pins 52 for pins being jumped over by bridge 68. These holding tabs 72 are later removed by an additional punching step, producing the final bridge 68 disconnected from the three jumped over insertion pins 52, as shown in FIG. 7C. A punching machine can be used to mechanically punch out each of holding tabs 72 from bridge 68.

An alternative process is to use punch machinery to remove all of the necks to bridge 68 at the same time. Necks 54 to other all of insertion pins 52 can be punched away next. Then the intermediate assembly of FIG. 7B is skipped over and the final assembly of FIG. 7C produced directly from FIG. 7A.

Another alternative is to use punch equipment to break all of the necks to bridge 68 and all of necks 54 to insertion pins 52 simultaneously so that insertion-pin frame 50 as well as holding tabs 72 are removed at the same time. FIG. 7C is arrived at directly by skipping FIG. 7B.

Figure 8A:
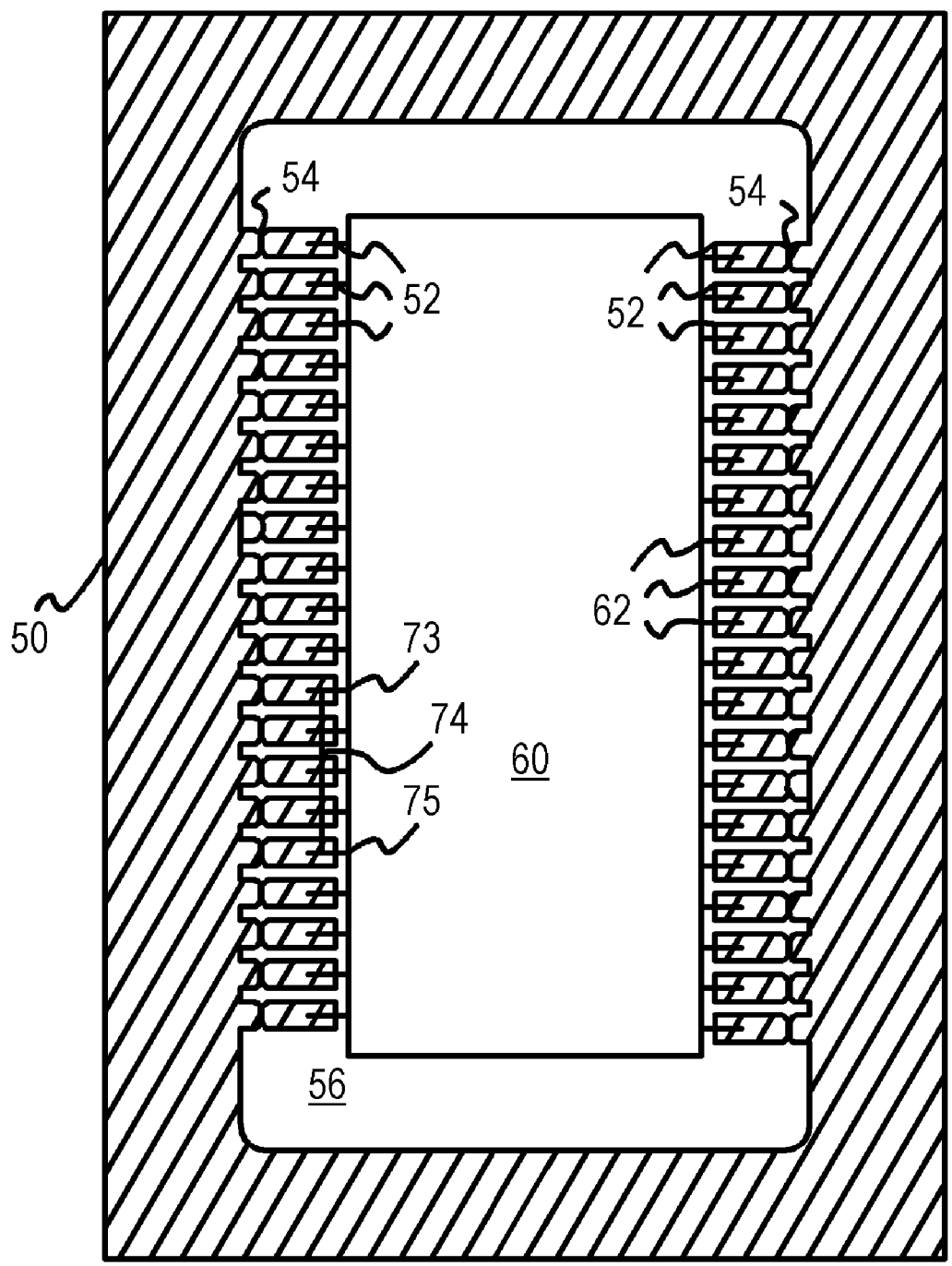
FIGS. 8A–B show using an insulated wire jumper.
Figure 8B:
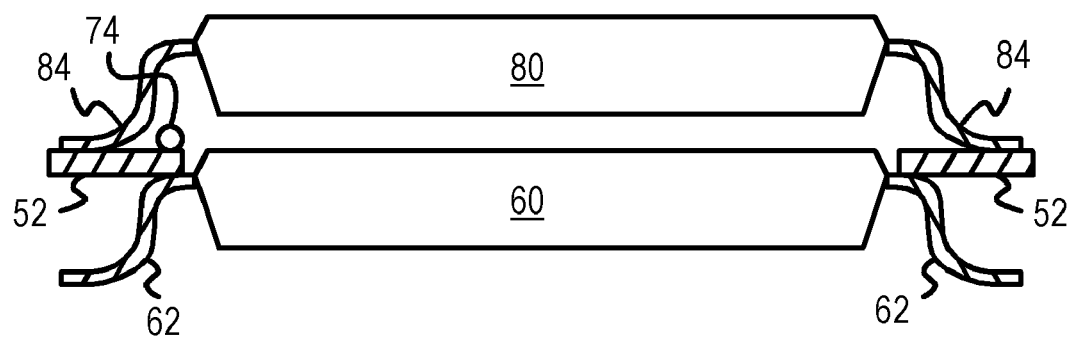

FIGS. 8A–B show using an insulated wire as a jumper. An alternative to bridges made from insertion-pin frame 50 is to use a fine insulated wire as the jumper. Wire 74 has its ends stripped of insulation and is placed between pins 73, 75 of insertion pins 52 after pins 62 of lower chip 60 have been soldered to insertion pins 52, but before upper chip 80 has been added to the assembly. For example, wire 74 could be added between the steps of FIGS. 6E and 6F, after printing of solder paste 82 but before placement of upper chip 80 and reflow. Wire 74 can be small enough to fit between insertion pins 52 and under upper pins 84, as shown in FIG. 8B. A solder re-flow step is then performed. Thus upper chip pins 84 and jumper wire 74 are both bonded to insertion pins 52 at the same time.

Figure 9:
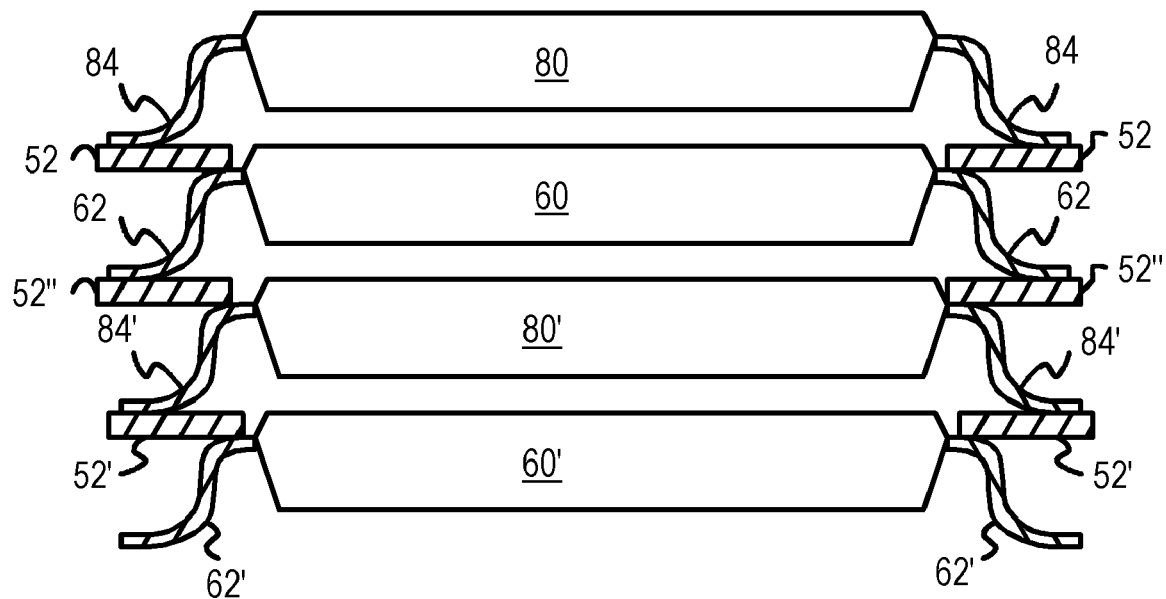
FIG. 9 shows a stack of four chips.

FIG. 9 shows a stack of four chips. The process can be extended to construct stacks having more than two chips. Chips 80, 60 can be assembled together with insertion pins 52 as described in the process of FIGS. 6A–G. Like-wise, a second stack of chips 80', 62' can be formed with insertion pins 52' again using the process of FIGS. 6A–G. Finally, pins 84' from the lower stack of chips 80', 60' are bonded to insertion pins 52" and then to upper pins 62 of the upper stack of chips 80, 60, which are bonded to insertion pins 52" using a similar process, but with a lower-temperature solder.

ALTERNATE EMBODIMENTS

Several other embodiments are contemplated by the inventors. Rather than have insertion pins 52 on two sides of the chip as shown in the figures, four sides of the frame opening could have insertion pins 52 when the memory chip has pins on all four sides. Stacking of chips could use other kinds of chips besides memory chips, such as dual processors in a stack, dual registers or dual buffers, etc.

Rather than select banks using chip-select, other signals could be used such as an address or data strobe signal. Some memories may have more than one chip select input, and some combination of these chip selects could be used to select the DRAM chips.

Various additional steps could be added to the process, such as cleaning steps. Various techniques and combinations of techniques may be used for making the necks. Rather than use an insertion-pin frame, a flex circuit board may be used. Many kinds of chip packages may be supported, such as PLCC, SOJ, SOP, TSOP, etc. The pitch of the insertion pins generally matches the pin pitch of the stacked chips, but some adjacent chip pins can have one insertion pin, such as for a bridge pin or for power and ground.

Wide or narrow DRAM chips of one, two, four, eight or more bits may be substituted. Memory modules may use stacked memory chips other than DRAMs, such as static random-access memory (SRAM) or flash memories, or improved DRAMs such as synchronous or super-pipelined DRAMs. Some bursting DRAMs re-name the CAS signal as the chip-enable signal (CE), since they do not need a column address for all accesses. The chip-enable signal may be considered as a type of CAS signal for some memories. In the examples pin 3 and pin 5 have been used for the chip select and no-connect, but these could be any pin locations and vary with the exact memory chip pinout. Additional bridges or jumpers could be added.

Directional terms such as upper, lower, top, bottom, above, below, under, flipped, etc. are arbitrarily assigned as shown in the Figures and can take on different meanings depending on orientation.

The invention could be used to stack other kinds of memory chips than DRAM, such as SRAM and flash memories, etc. The invention could be applied to other kinds of modules besides memory modules, and could be used for stacking other kinds of chips such as buffers, registers, latches, processing arrays, etc.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. Sect. 1.72(b). Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A process for stacking chips comprising:
   forming insertion pins connected to an insertion-pin frame by necks, the insertion pins having a pitch matching a pitch of pins on a first chip;
   wherein the insertion pins and the insertion-pin frame are flat and co-planar;
   applying a first solder paste to a first surface of the insertion pins;
   aligning the first chip to the insertion-pin frame and placing first pins of the first chip onto the first solder paste on the first surface of the insertion pins;
   re-flowing the first solder paste by heating the insertion pins and the first pins to generate a first intermediate assembly;
   applying a second solder paste to a second surface of the insertion pins, the second surface opposite the first surface;
   aligning a second chip to the insertion-pin frame and placing second pins of the second chip onto the second solder paste on the second surface of the insertion pins;
   re-flowing the second solder paste by heating the insertion pins and the second pins to generate a second intermediate assembly; and
   detaching the insertion pins from the insertion-pin frame by breaking the necks between the insertion pins and the insertion-pin frame to form a final assembly of the first chip, the second chip, and the insertion pins, whereby the first chip is stacked with the second chip using the insertion pins that are flat and co-planar.

2. The process for stacking chips of claim 1 further comprising:
   inverting the first chip before aligning the first chip to the insertion-pin frame and placing first pins of the first chip onto the first solder paste on the first surface of the insertion pins; and
   inverting the first intermediate assembly before applying the second solder paste.

3. The process for stacking chips of claim 2 further comprising:
forming a jumper connection from a first pin location to a second pin location on the second chip.

4. The process for stacking chips of claim 3 wherein the first pin location is a no-connect pin and the second pin location is a chip-select pin input.

5. The process for stacking chips of claim 3 further comprising:
forming the jumper connection as a bridge pin between two adjacent insertion pins, the bridge pin having a cutout to prevent soldering of a first pin that is the chip-select pin input to a first surface of the bridge pin;
wherein second pins for the chip-select pin input and the no-connect pin of the second chip are soldered to a second surface of the bridge pin.

6. The process for stacking chips of claim 3 further comprising:
placing an insulated wire with stripped ends between the second surface of the insertion pins and the second pins before re-flowing the second solder paste;
wherein the insulated wire is a jumper connection from a first pin location to a second pin location on the second chip.

7. The process for stacking chips of claim 3 further comprising:
forming the jumper connection as a bridge between two non-adjacent insertion pins, the bridge being connected to the insertion-pin frame by bridge necks; and
detaching the bridge from the insertion-pin frame by breaking the bridge necks.

8. The process for stacking chips of claim 7 wherein the bridge surrounds a first plurality of the insertion pins;
wherein the bridge is connected to the first plurality of the insertion pins by holding tabs;
wherein the holding tabs are removed by punch equipment.

9. The process for stacking chips of claim 7 wherein detaching the bridge from the insertion-pin frame comprises using punch equipment to remove the bridge necks.

10. The process for stacking chips of claim 7 wherein the bridge is outside of a gap under the second chip and above the first chip.

11. The process for stacking chips of claim 4 wherein the first chip and the second chip are memory chips.

12. The process for stacking chips of claim 11 wherein the first chip and the second chip are dynamic-random-access memory (DRAM) chips or flash-memory chips.

13. The product made by the process of claim 1, wherein the product is the final assembly of the first chip, the second chip, and the insertion pins.

14. The process for stacking chips of claim 1 further comprising:
using a middle insertion-pin frame with middle insertion pins to bond an upper final assembly to a lower final assembly to produce a 4-chip stack,
wherein the upper final assembly and the lower final assembly are each a final assembly produced by the process of claim 1.

15. The process for stacking chips of claim 1 wherein re-flowing the second solder paste by heating comprises heating to a lower temperature than a temperature for re-flowing the first solder paste by heating.

16. A method of manufacturing a stacked-chip assembly comprising:
printing regions of first solder paste onto first co-planer surfaces of insertion pins that are connected to an insertion-pin frame by frame necks;
placing top shoulders of lower pins of a lower chip into the regions of the first solder paste and heating the first solder paste to produce a first intermediate assembly;
printing regions of second solder paste onto second co-planer surfaces of insertion pins;
wherein the first co-planar surfaces are opposite the second co-planar surfaces;
placing feet of upper pins of an upper chip into the regions of the second solder paste and heating the second solder paste to produce a second intermediate assembly; and
breaking the necks to detach the insertion-pin frame from the second intermediate assembly with the insertion pins to generate the stacked-chip assembly,
whereby the stacked-chip assembly of the upper chip and the lower chip is held together by the insertion pins that have co-planar surfaces.

17. The method of claim 16 wherein non-adjacent upper pins are bridged using a wire under the upper pins, or an outer bridge outside of the frame opening,
wherein the outer bridge is formed from the insertion-pin frame.

18. The method of claim 16 wherein adjacent upper pins are bridged using a bridge pin that is soldered to the feet of two upper pins and soldered to the top shoulder of only one of two lower pins.

* * * * *